United States Patent [19]

Takahashi et al.

[11] Patent Number: 4,468,614

[45] Date of Patent: Aug. 28, 1984

[54] AVERAGE FREQUENCY MEASURING APPARATUS

[75] Inventors: Toshiro Takahashi; Shoji Niki, both of Saitama, Japan

[73] Assignee: Takeda Riken Kogyo Kabushiki Kaisha, Tokyo, Japan

[21] Appl. No.: 378,268

[22] Filed: May 14, 1982

[30] Foreign Application Priority Data

May 22, 1981 [JP] Japan .................................. 56-77848

[51] Int. Cl.³ ............................................ G01R 23/10
[52] U.S. Cl. .................................... 324/78 D; 324/82
[58] Field of Search ............... 324/78 D, 79 D, 83 D; 331/25; 364/484, 575; 377/19, 24

[56] References Cited

U.S. PATENT DOCUMENTS 3,609,326  9/1971  Bagley et al. .................... 324/79 D
4,142,177  2/1979  Davis ................................. 324/78 D
4,310,891  1/1982  Niki .................................... 364/484

Primary Examiner—Michael J. Tokar
Assistant Examiner—B. J. Kelley
Attorney, Agent, or Firm—Staas & Halsey

[57] ABSTRACT

An average frequency measuring apparatus in which auxiliary gate signals are converted into synchronized gate signals synchronized with either input signals or clock signals; first and second gates are opened by the synchronized gate signals; the input signals and the clock signals having passed through the first and second gates are counted by first and second counters, respectively; and the frequency of the input signals is calculated from the count values of the first and second counters for a plurality of occurrences of the synchronized gate signal. A third counter is provided for counting the number of the synchronized gate signals, and a minimum counting time is calculated by calculating means from the count values of the third and second counters and the set measurement accuracy. When it is detected from the count value of the second or third counter that the actual counting time has been exceeded, measurement is stopped, thereby obtaining measured results of accuracy at least higher than the set measurement accuracy.

24 Claims, 34 Drawing Figures

FIG. 1
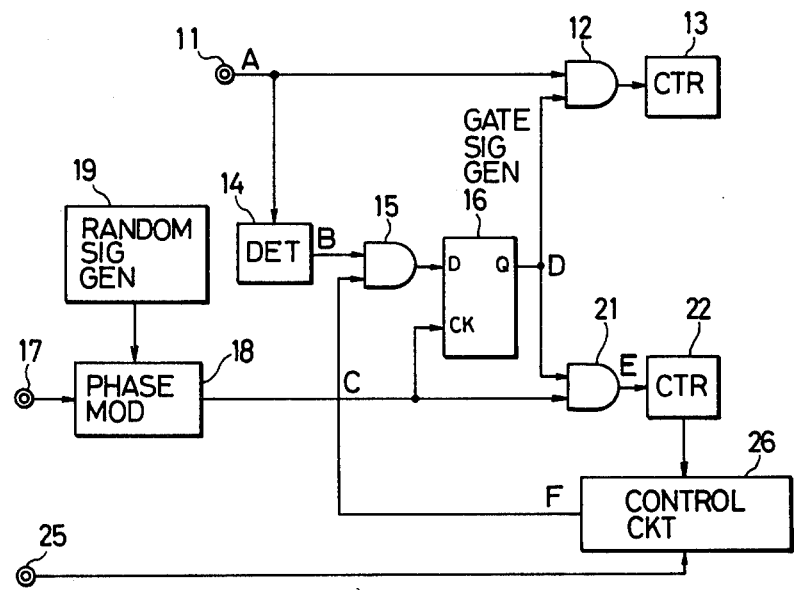
FIG. 2A
FIG. 2B
FIG. 2C
FIG. 2E
FIG. 2D
FIG. 2F

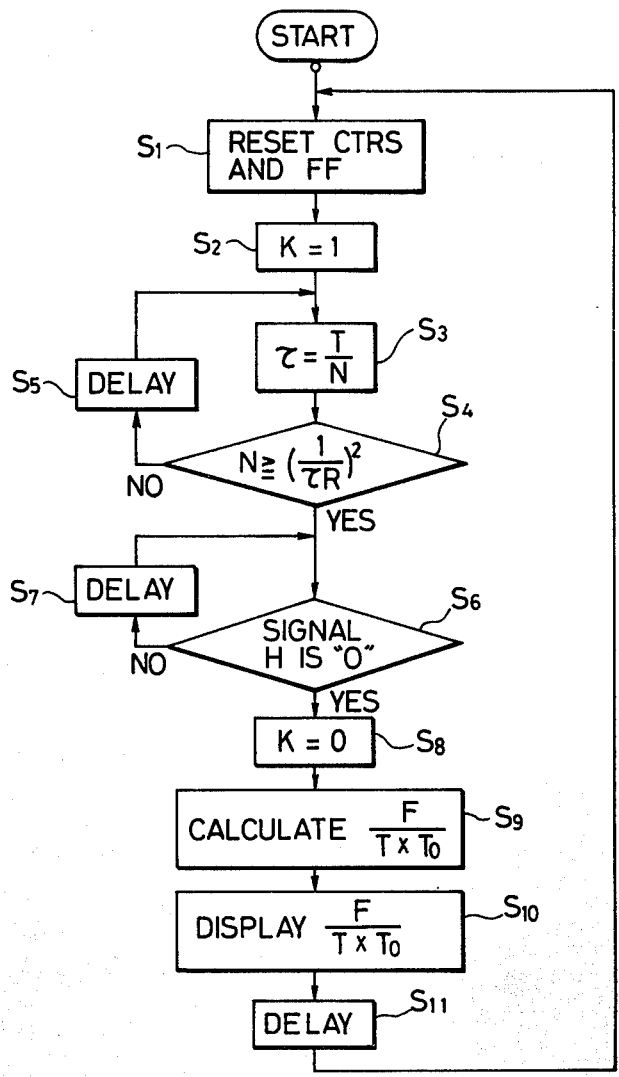

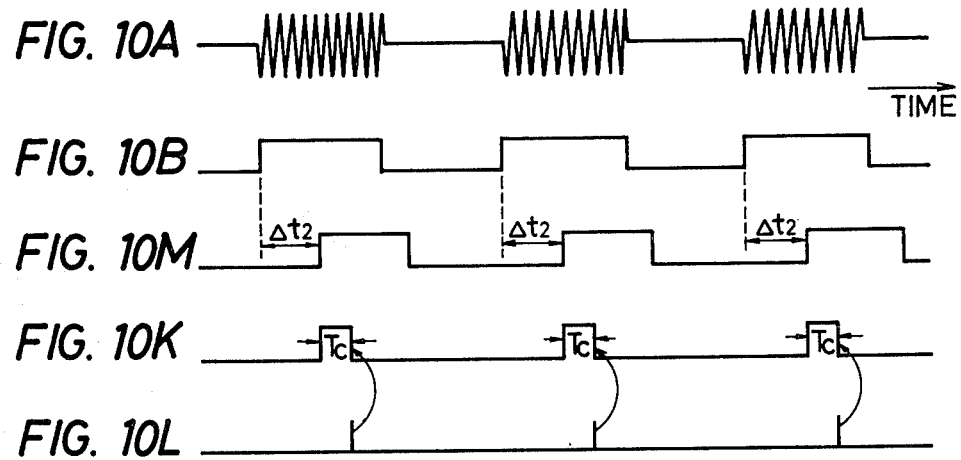
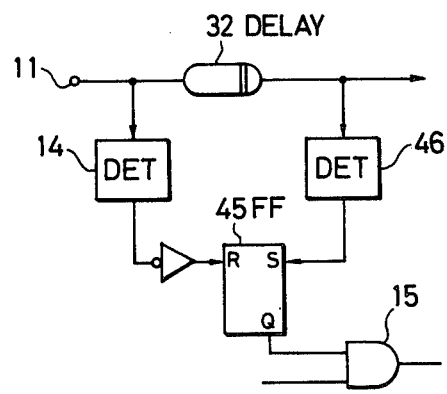

AVERAGE FREQUENCY MEASURING APPARATUS

BACKGROUND OF THE INVENTION

The present invention relates to an average frequency measuring apparatus which measures the frequency of an input signal a plurality of times and averages the measured values to thereby obtain the input frequency with higher accuracy.

A method that has been used for measuring the frequency of an input signal is to gate the input signal by a gate signal of a fixed duration, to count the number of cycles in the gated output as a pulse for each cycle and to obtain the input frequency from the count value. In this case, there is a possibility that the count value varies by one count from another count value for the same input frequency due to the relative phase relation between the input signal and the gate signal, resulting in what is called a quantizing error. With a view to minimizing the influence of such a quantizing error, a method is employed in which the frequency of the input signal is measured a plurality of times and the average of the measured values is regarded as the correct frequency of the input signal. With such a method, however, if the relative phase relation between the input signal and the gate signal for each measurement is constant, then the averaging of the measured values loses its meaning. How to vary the relative phases of the input signal and the gate signal at random from this viewpoint is set forth in U.S. Pat. No. 3,938,042 entitled "Measurement Averaging Counting Apparatus Employing a Randomly Phase Modulated Time Base to Improve Counting Resolution" issued on Feb. 10, 1976. In the apparatus set forth in this patent, a clock signal is phase modulated by random noise and the phase modulated clock signal is frequency multiplied to obtain a clock signal for counting. But this apparatus is defective in that it necessitates the use of a relatively complex modulator for the phase modulation and a frequency multiplier. Moreover, this apparatus has the defect of low measurement accuracy because the phase of the clock signal undergoes variations even during the counting operation.

On the other hand, there are some occasions when it is desired to measure the carrier frequency of a signal whose carrier signal has been amplitude modulated 100% by a pulse signal, that is, what is called a burst signal having a discontinuous carrier signal. In the measurement of the carrier frequency of such a burst signal, even if the carrier frequency is measured by counting the number of carrier cycles in one burst signal, no satisfactory accuracy can be obtained when the burst signal width is small. To avoid this, the measurement is carried out by counting the number of carrier cycles for a plurality of burst signals; in this case, however, when the measurement period is made constant, the measurement accuracy varies with the length of each burst signal.

Further, from the viewpoint of increasing the accuracy in the measurement of the carrier frequency of the burst signal, a count is taken of the carrier in a plurality of burst signals. In such a case, in order to lessen the influence of the quantizing error present for each burst signal, the phase of the gate signal is changed at random relative to each burst signal. However, if the width of each gate signal is made small so that the gate signal should not extend outside the corresponding burst signal, the time available for counting the carrier is reduced. Therefore, to improve the measurement accuracy, the overall measurement time must be lengthened.

SUMMARY OF THE INVENTION

It is therefore an object of the present invention to provide an average frequency measuring apparatus with which it is possible to obtain a measured value of a desired accuracy.

Another object of the present invention is to provide an average frequency measuring apparatus which causes the relative phase of an input signal with respect to a gate signal to vary at random, and which is relatively simple in structure.

Another object of the present invention is to provide an average frequency measuring apparatus which is capable of measuring a carrier of burst signals with a desired accuracy in a relatively short time.

Yet another object of the present invention is to provide an average frequency measuring apparatus which is capable of measuring the frequency of a desired portion of a burst signal.

According to the present invention, an auxiliary gate signal for roughly determining a counting period is repeatedly generated from auxiliary gate signal generating means, and the auxiliary gate signal is converted by a gate signal generator into a synchronized gate signal synchronized with a clock signal or an input signal. By the synchronized gate signal, a first gate is opened and while it is open, the input signal is cumulatively counted by a first counter. A second gate is also opened by the synchronized gate signal and, is open, the clock signals are cumulatively counted by a second counter. Furthermore, the number of the synchronized gate signals is counted by a third counter. A minimum counting period corresponding to a previously set desired measurement accuracy R is calculated by calculating means from the count values T and N of the second and third counters and the desired measurement accuracy R. When the counting period exceeds the minimum counting period, this is detected from the count value T of the second counter and, by this detection, the gate signal generator is stopped from generating the synchronized signals. From the count values F and T of the first and second counters, at the time of stopping the operation of the gate signal generator, the frequency of the input signal is calculated and the calculation result is displayed on a display.

As described above, according to the present invention, the minimum counting period corresponding to the desired measurement accuracy R is calculated and, when the counting period exceeds the minimum counting period, the measurement is stopped. This ensures that the measurement is performed with higher accuracy than the set desired accuracy R.

Moreover, a means is provided, as required, for changing the relative phase of the input signal with respect to the clock signal at random. With this phase variation means, the output from a voltage controlled oscillator is frequency divided by a frequency divider, as required, and supplied to a phase comparator for phase comparison with a reference signal. The phase compared output and a random signal of randomly varying level from a random signal generator are added together by an analog adder. The oscillation frequency of the voltage controlled oscillator is controlled by the added output. In this way, a clock signal of randomly varying phase is obtained from the voltage controlled oscillator with a simple arrangement. In this case, by using the frequency divider, a clock signal is obtained which has a frequency obtained by multiplying the frequency of the reference signal; namely, frequency multiplication and phase modulation are carried out concurrently. A sample hold circuit is provided, which samples the random signal by the gate signal, and the output from the sample hold circuit is applied to the adder, so that the phases of the clock pulses are held constant during the counting of the clock signals, thereby permitting measurement of greater accuracy.

BRIEF DESCRIPTION OF THE DRAWINGS

FIG. 1 is a block diagram showing an average frequency measuring apparatus which can be deduced from the prior art;

FIG. 2 is a timing chart explanatory of the operation of the apparatus shown in FIG. 1;

FIG. 6 is a flow chart showing an example of the operation of the microcomputer depicted in FIG. 5;

FIGS. 10A to 10L, inclusive, are timing charts explanatory of the operation of the apparatus shown in FIG. 9;

FIG. 11 is a block diagram illustrating another example of auxiliary gate signal generating means;

DETAILED DESCRIPTION OF THE PREFERRED EMBODIMENTS

Figure 3:
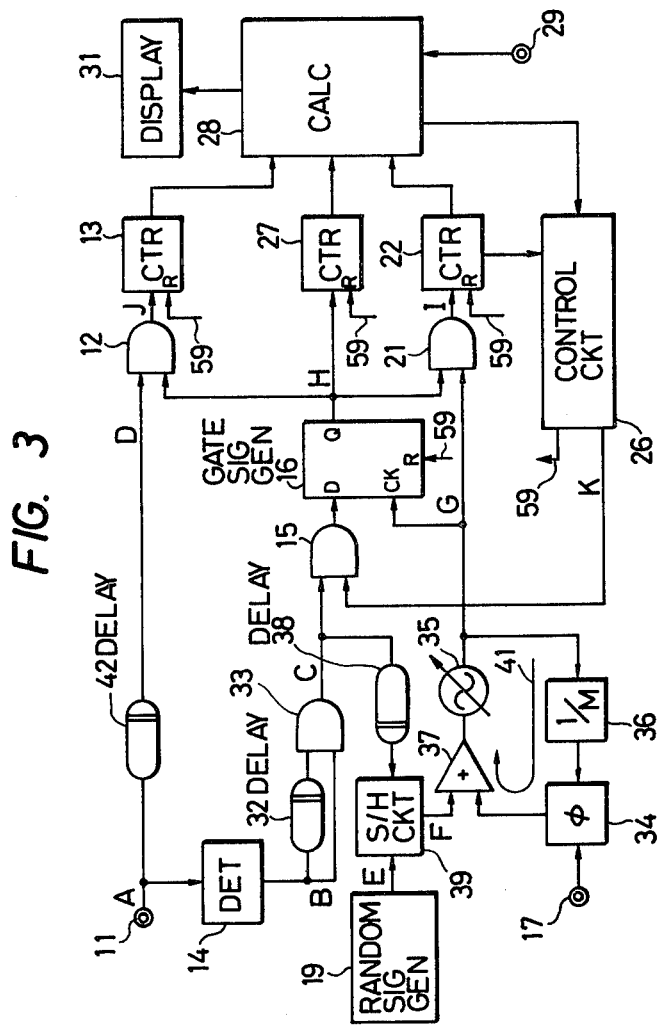
FIG. 3 is a clock diagram illustrating an embodiment of the average frequency measuring apparatus of the present invention.

To facilitate a better understanding of the present invention, a description will be given first, with reference to FIG. 1, of an average frequency measuring apparatus that is deducible from the prior art. An input signal from an input terminal 11 is applied to a gate circuit 12 and its gated output is cumulatively counted by a counter 13. In the case where the input signal is a pulse modulated wave such as shown in FIG. 2A, wherein what is called a burst signal and its carrier frequency is to be measured, the frequency measurement takes place only in the duration of each of the bursts and, to this end, an auxiliary gate signal is produced for roughly determining the counting period therefor. The signal from the input terminal 11 is branched to a detector 14 and its envelope detected output (FIG. 2B) is provided as the auxiliary gate signal to a gate signal generator 16 via a gate circuit 15. The gate signal generator 16 yields a synchronized gate signal synchronized with a clock signal, and the gate signal generator 16 is constituted by, for instance, a D type flip-flop, which is supplied at its data terminal D with the output from the gate circuit 15. To a clock terminal ck of the flip-flop 16 is applied a clock signal, the phase of which varies at random. That is to say, the clock signal from a terminal 17 is provided to a phase modulator 18, wherein it is phase modulated by a random signal from a random signal generator 19 and the modulated clock signal is applied to the clock terminal ck of the flip-flop 16.

Accordingly, a Q output from the flip-flop 16 becomes a synchronized gate signal which rises and falls concurrently with clocks of the output clock signal from the phase modulator 18 (FIG. 2C) and has a duration corresponding to that of the pulse modulated signal of the input signal. This synchronized gate signal becomes such as shown in FIG. 2D and it is applied to the gate circuits 12 and 21 to control their operation. To the gate circuit 21 is supplied the clock signal from the phase modulator 18. The output from the gate circuit 21 is cumulatively counted by a counter 22. At a terminal 25 is set a measurement time, which is compared by a control circuit 26 with the count value of the counter 22 and, in the case of coincidence being detected therebetween, the control circuit 26 generates such a control signal as shown in FIG. 2F which closes the gate circuit 15.

In this way, the synchronized gate signal is generated by the gate signal generator 16 a plurality of times and, upon each occurrence of the gate signal, the gate circuits 12 and 21 are opened, and the input signal and the clock signal passing through them at that time are cumulatively counted by the counters 13 and 22, respectively. By computing F/T for their count values F and T, the computation result leads to the measured frequency. Incidentally, a method of increasing the measurement accuracy by controlling the gate circuits 12 and 21 to open and close through the use of a synchronized gate signal synchronized with a clock signal or an input signal as described above is disclosed in U.S. Pat. No. 3,609,326 "Counting Apparatus and Method Using Separate Counters for Reference and Unknown Signal" issued on Sept. 28, 1971.

In the average frequency measuring apparatus shown in FIG. 1, letting $\tau$ stand for the width of the synchronized gate signal from the gate signal generator 16 and N stand for the number of synchronized gate signals occurring in a period Tg during which the counters 13 and 22 perform their counting operation, the measurement accuracy becomes $$\frac{1}{\tau} \times \frac{1}{\sqrt{N}}.$$

Since N is Tg/τ, the measurement accuracy becomes $$\frac{1}{\sqrt{\tau \cdot Tg}}.$$

That is to say, the larger the number N of the synchronized gate signals and the longer the counting period Tg is, the higher the measurement accuracy becomes; furthermore, the measurement accuracy improves with an increase in the width τ of the synchronized gate signal. The measurement accuracy is measured in units of Hz, and the smaller its value, the higher the accuracy is.

The width τ of the synchronized gate signal varies with the pulse width τ' of the input signal and consequently the measurement accuracy changes with the pulse width of the input signal. Therefore, once a required measurement accuracy R (Hz) is determined, it is necessary to select the counting period Tg to be larger than a value given by $$\left(\frac{1}{R\,(Hz)}\right)^2 \times \frac{1}{\tau}.$$

In order to keep the measurement accuracy unchanged regardless of a variation in the pulse width τ' of the input signal, the counting period Tg has to be determined based on the pulse width τ'; however, since the pulse width τ' is unknown, the counting period Tg cannot be determined. Therefore, measurement cannot be carried out with the same measurement accuracy at all times.

Next, a description will be given, with reference to FIG. 3, of an embodiment of the average frequency measuring apparatus of the present invention. In FIG. 3, the parts corresponding to those in FIG. 1 are identified by the same reference numerals and no detailed description will be repeated thereof. According to the present invention, a counter 27 is provided, by which is counted the number N of synchronized gate signals from the gate signal generator 16. The count values of the counters 13, 22 and 27 are supplied to a calculator 28, in which is inputted the required measurement accuracy R that is set at a terminal 29. The calculator 28 calculates a required counting period based on the count values of the counters 22 and 27 and the accuracy set at the terminal 29. Dividing the count value T of the counter 22 by the count value N of the counter 27, the pulse width τ of the synchronized gate signal is obtained and, based on the pulse width τ and the measurement accuracy R set at the terminal 29, the minimum counting time $$\frac{1}{\tau}\left(\frac{1}{R}\right)^2$$

is calculated. The counting period Tg of a value equal or larger than the calculated value is determined and provided to the control circuit 26. When the overall counting period exceeds this value, that is, when the count value of the counter 22 exceeds the value Tg, the gate circuit 15 is closed. After the closure of the gate circuit 15, F/T is calculated from the count values F and T of the counters 13 and 22, and the measured frequency is displayed on a display 31. Precisely speaking, the value of the pulse width τ is a value obtained by the multiplication of T/N by the period t₀ of the clock signal; however, if T/N is employed, a required counting period can be known by the comparison of Tg with the count value of the counter 22.

Figure 4:
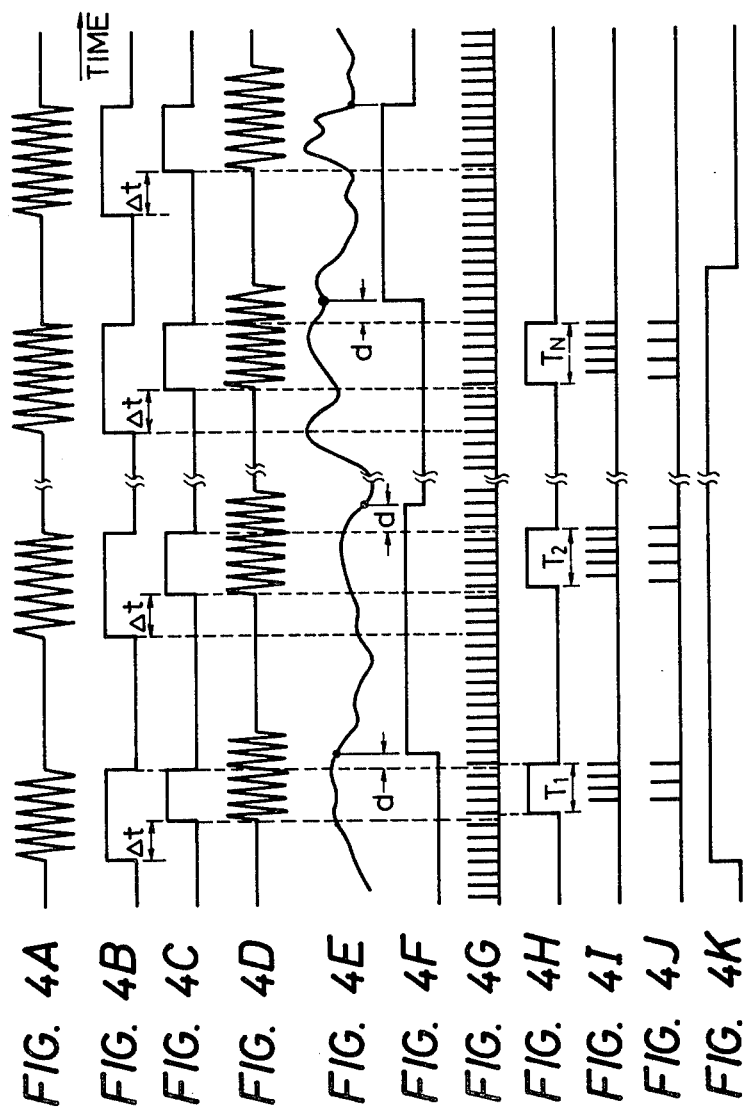
FIGS. 4A to 4K, inclusive, are timing charts explanatory of the operation of the apparatus depicted in FIG. 3.

The embodiment of FIG. 3 is arranged so that the phases of the input signal to be measured and the synchronized gate signal are varied relative to each other for each measurement, that is, upon each occurrence of the gate signal. Therefore, in this embodiment, the detected output from the detector 14 is supplied to an AND circuit 33 directly and via a delay circuit 32. Accordingly, for instance, in the case of such a pulse modulated input signal as shown in FIG. 4A, the detector 14 yields such a detected output as is depicted in FIG. 4B, which is delayed by the delay circuit 32 for a period of time Δt and applied to the AND circuit 33. In consequence, there is derived at the output of the AND circuit 33 an auxiliary gate signal which rises Δt behind the output from the detector 14 but falls in synchronism therewith as shown in FIG. 4C. The output from the AND circuit 33 is provided to the gate circuit 15.

On the other hand, the reference signal at the terminal 17 is supplied to a phase comparator 34, in which the output from a frequency divider 36 which frequency-divides the output from a voltage controlled oscillator or the so-called VCO 35 down to 1/M is compared in phase with the reference signal, and the phase compared output is applied to an analog adder 37. The output from the AND circuit 33 is also provided to a sample hold circuit 39 via a delay circuit 38 for timing use. A little after the fall of the auxiliary gate signal from the AND circuit 33, the sample hold circuit 39 samples and holds the random signal from the random signal generator 19, such as shown in FIG. 4E which varies at random in level. The sample hold value undergoes random variations for each auxiliary gate signal as depicted in FIG. 4F and it is supplied to the analog adder 37. In other words, the VCO 35, the frequency divider 36, the phase comparator 34 and the analog adder 37 constitute a phase lock loop or the so-called PLL 41. The output from the VCO 35 is stabilized with the stability of the reference signal from the terminal 17 and a clock signal of a frequency M times that of the reference signal is obtained from the VCO 35. The oscillation phase of the VCO 35 is varied for each gate signal by such a random signal as shown in FIG. 4F which is applied to the analog adder 37, and the phase is retained until it is changed next. The output from the VCO 35 is provided as a clock signal to the clock terminal ck of the flip-flop 16 and the gate circuit 21.

The input signal from the terminal 11 is applied via a delay circuit 42 to the gate circuit 12. The delay of the delay circuit 42 is selected such that the synchronized gate signal (FIG. 4H) may always occur in the duration of the pulse modulated wave (FIG. 4D) from the delay circuit 42 regardless of the phase variation by the random signal generator 19. By the synchronized gate signal, the gate circuits 12 and 21 are controlled and their output signals of FIGS. 4J and 4I are counted by the counters 13 and 22, respectively.

In this case, the gate signal generator 16 generates the synchronized gate signal of a width which is an exact integral multiple of the period of the clock signal and, by this synchronized gate signal, the gate circuits 12 and 21 are controlled. From the count values N and T of the counters 27 and 22 obtained when such synchronized gate signal has been generated a plurality of times, a calculation, $T/N=\tau$, is conducted as referred to previously, thereby to obtain the value $\tau$. Then the counting period Tg is determined so that it may be larger than $$\frac{1}{\tau}\left(\frac{1}{R}\right)^2.$$

Alternatively, the gate circuit 15 is opened until the count value N of the counter 27 exceeds $$\left(\frac{1}{\tau}\times\frac{1}{R}\right)^2.$$

That is to say, for the predetermined measurement accuracy R either when the counting period Tg exceeds $$\frac{1}{\tau}\left(\frac{1}{R}\right)^2$$

or when the count value N exceeds $$\left(\frac{1}{\tau}\cdot\frac{1}{R}\right)^2,$$

the control circuit 26 closes the gate circuit 15, stopping the measurement. It is also possible to substitute $\tau=T/N$ into $$\left(\frac{1}{\tau}\times\frac{1}{R}\right)^2$$

and hold open the gate circuit 15 until the count value N of the counter 27 becomes smaller than $T^2R^2$.

Figure 5:
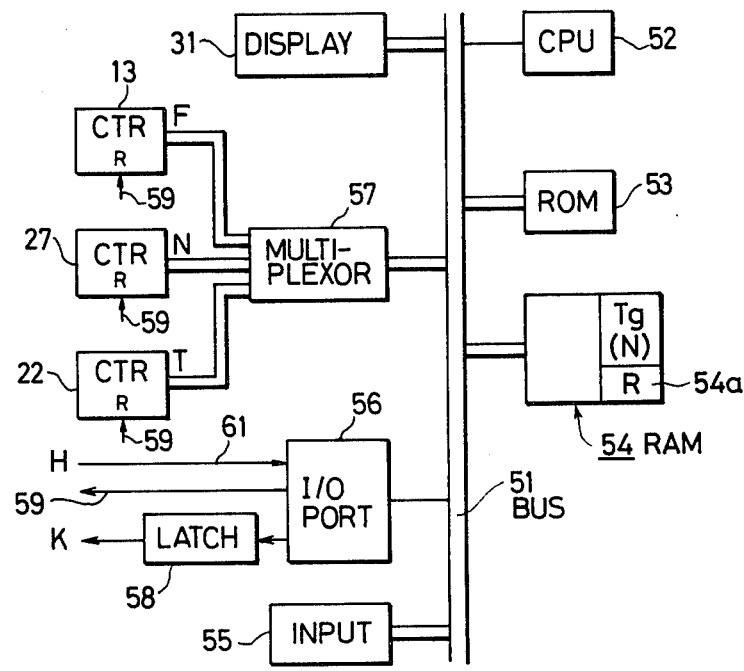
FIG. 5 is a block diagram showing a modified form of the embodiment of FIG. 3 in which a control circuit 26 and a calculator 28 are constituted by a microcomputer.

In the embodiment of FIG. 3, both the control circuit 26 and the calculator 28 can be constituted by a microcomputer. For example, as illustrated in FIG. 5, a central processing unit or the so-called CPU 52, a read only memory 53, a read/write memory 54, input means 55 such as a keyboard, an input/output port 56 and a multiplexer 57 are connected to an internal bus 51. An internal port (not shown) is interposed between the input means 55 and the bus 51. Further, the display 31 is connected via an output port (not shown) to the bus 51. To the multiplexer 57 are connected the counters 13, 22 and 27 and, by controlling the multiplexer 57, the count values of these counters 13, 22 and 27 can be fetched into the microcomputer. A signal (FIG. 4K) for controlling the gate circuit 15 in FIG. 3 can be provided via the input/output port 56 to a latch circuit 58; a reset signal can be provided on a lead 59; and the synchronized gate signal (FIG. 4H) can be inputted via a lead 61 into the microcomputer. Desired measurement accuracy R is set by the input means 55 and the set value R is inputted for storage in an area 54a of the memory 54.

The CPU 52 sequentially reads out a program stored in the memory 53 and interprets and executes it, thereby executing predetermined processing. That is, upon starting the apparatus, the reset signal is provided on the lead 59 in step $S_1$ to reset the counters 13, 22 and 27 and the flip-flop 16 in FIG. 3 as shown in an operational flowchart of FIG. 6. In step $S_2$ the latch circuit 58 is set to a high level "1" and a control signal K is produced to open the gate circuit 15 in FIG. 3. In step $S_3$ the count values T and N of the counters 22 and 27 are fetched and a calculation, $\tau=T/N$, is performed. In step $S_4$ $$\left(\frac{1}{\tau R}\right)^2$$

is computed from the calculation result $\tau$ and the set measurement accuracy R, and the computation result is compared with the count value N. In this case, if the latter is smaller than the former, then the operation returns to step $S_3$ after the lapse of a proper period of time in step $S_5$. When the count value N is larger than $$\left(\frac{1}{\tau R}\right)^2$$

in step $S_4$, then the operation proceeds to step $S_6$, in which the synchronized gate signal H is inputted from the lead 61 and it is checked whether the synchronized gate signal becomes low-level "0". In the case where the gate signal remains high-level, the operation returns to step $S_6$ after the lapse of a suitable period of time in step $S_7$. When it is detected in step $S_6$ that the synchronized gate signal has become low-level, the operation proceeds to step $S_8$, in which "0" is set in the latch circuit 58 and the control signal K for the gate circuit 15 becomes low-level, stopping the measurement. In step $S_9$ the count values of the counters 13 and 22 are inputted and $$\frac{F}{T\times t_0}$$

($t_0$ being the period of the clock signal) is computed and the computation result is provided to the display 31 in step $S_{10}$. Thereafter, the operation returns to step $S_1$ after the lapse of a proper period of time in step $S_{11}$, thus restarting the measurement.

Figure 7:
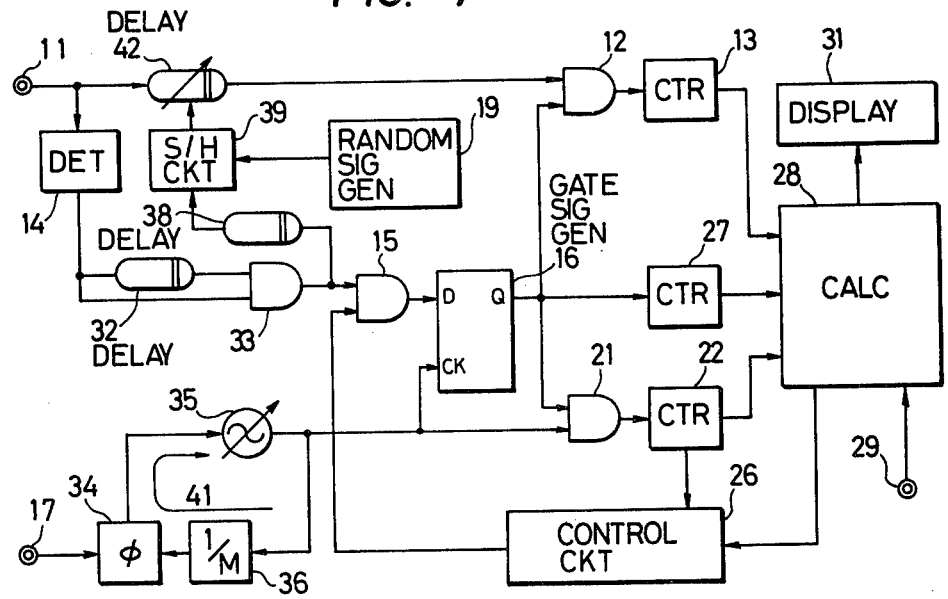
FIG. 7 is a block diagram illustrating another embodiment of the average frequency measuring apparatus in which the phase of an input signal is varied at random.
Figure 8:
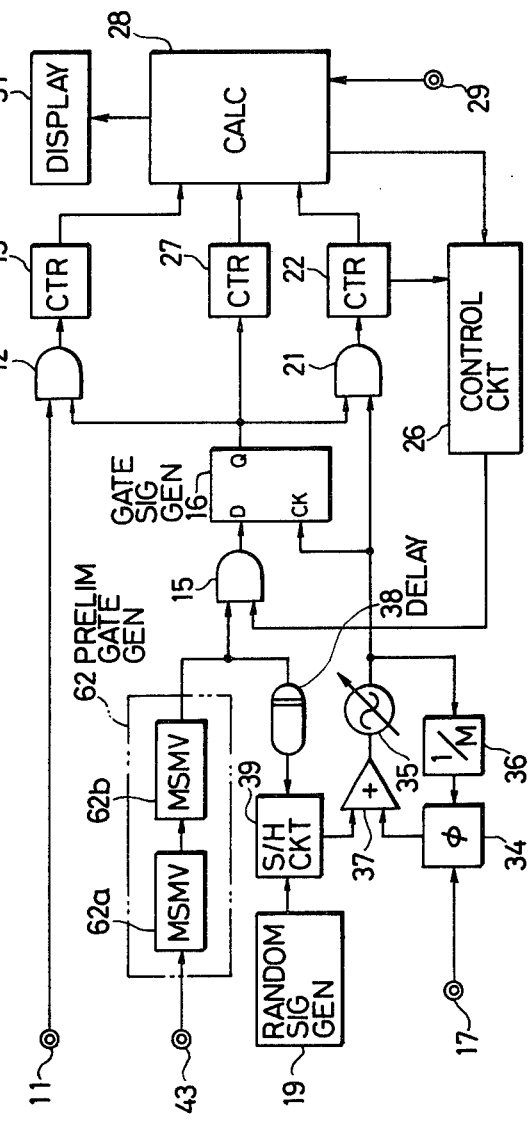
FIG. 8 is a block diagram illustrating another embodiment of the average frequency measuring apparatus of the present invention in which an auxiliary gate signal is generated by a timing signal.

In order to change the phases of the input signal and the synchronized gate signal relative to each other upon each occurrence of the latter, the phase of the input signal, for instance, may also be changed. That is to say, as shown in FIG. 7, the delay circuit 42 is formed as a variable delay circuit or a ladder circuit comprising, for example, a coil and a varactor, and the control voltage of the varactor is controlled by the output from the sample hold circuit 39. In this case, the adder 37 of the PLL 41 in FIG. 3 is left out. In FIGS. 3 and 7, the signal at the input terminal 11 is detected and supplied to the gate signal generator 16 but, in the case of a certain signal to be measured, it may happen that a timing signal synchronized with its burst signal is generated from its signal source. In such a case, it is possible to employ such a circuit arrangement as depicted in FIG. 8, in which the timing signal is provided from a terminal 43 to an auxiliary gate generator 62 and an auxiliary gate signal derived therefrom is fed to the gate circuit 15 and, at the same time, it is applied via the delay circuit 38 to the sample hold circuit 39. The auxiliary gate generator 62 is constituted, for instance, by a cascade connection of monostable multivibrators 62a and 62b and, by suitably selecting the pulse width of the output from each of the multivibrators 62a and 62b to adjust the leading and trailing edges of the auxiliary gate signal, it is possible to obtain an auxiliary gate signal corresponding to a desired position of the burst signal. Also it is possible to employ such a circuit arrangement in which an input signal of a continuous wave is applied to the input terminal 11 and pulses of a suitable frequency are provided to the terminal 43, thereby to measure the average frequency of the continuous wave signal.

Figure 9:
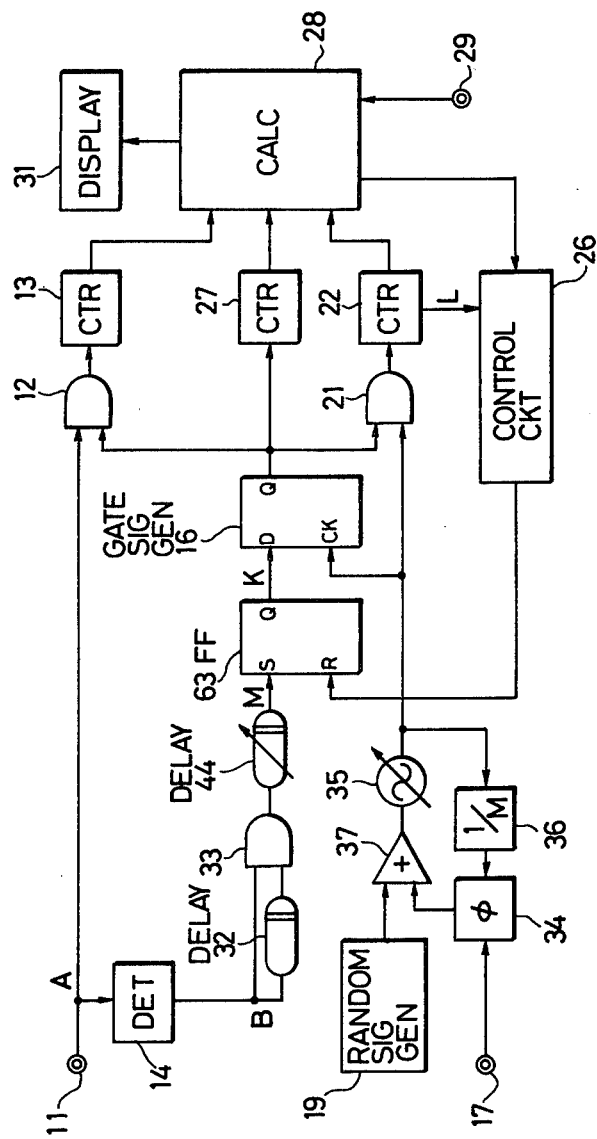
FIG. 9 is a block diagram illustrating another embodiment of the average frequency measuring apparatus of the present invention which is arranged so that the position of a synchronized gate signal is made variable.

Alternatively, the auxiliary gate signal from the AND circuit 33 is applied via a variable delay circuit 44 to a set terminal S of an edge trigger type flip-flop 63 as shown in FIG. 9. that is, such a signal as depicted in FIG. 10M which rises up behind the rise-up of the output from the detector 14 (FIG. 10B) by a delay $\Delta t_2$ caused by the delay circuit 44 is obtained at the output of the delay circuit 44. By the rise-up of this delayed signal, the flip-flop 63 is set and its output rises up as shown in FIG. 10K and is supplied to the gate signal generator 16. FIG. 10A shows the input signal to the input terminal 11. The counter 22 is arranged such that upon each counting of a predetermined value L the counter 22 resets itself and generates a pulse as illustrated in FIG. 10L, by which the control circuit 26 resets the flip-flop 63 as shown in FIG. 10K. Consequently, a synchronized gate signal is generated from the gate signal generator 16 corresponding to the period in which the Q output from the flip-flop 63 remains high-level, and the gates 12 and 21 are opened only for the duration of the synchronized gate signal. By repeating such operations, $\tau = T/N$ is calculated and when the count value N of the counter 27 has become larger than $$\left(\frac{1}{\tau} \times \frac{1}{R}\right)^2,$$

the control circuit 26 disables the flip-flop 63, completing the counting operation. In this way, the frequency measurement can be achieved at a desired timing and with a desired gate signal width, by selecting the delay of the variable delay circuit 44 and adjusting the set value for generating pulses from the counter 22. In other words, the arrangement of FIG. 9 performs the same operation as that by the arrangement of FIG. 8 which performs the measurement using a desired auxiliary gate signal generated from the auxiliary gate generator 62. As explained before, the counter 22 is reset upon each counting of a preset value and since the number of resettings agree with the count value of the counter 27, the value of $\tau$ can be computed by obtaining the product of the predetermined set value of the counter 22 and the count value of the counter 27 through the use of the calculator 28, and the value of $\tau$ corresponds to the set value of the counter 22. Moreover, in this example, the sample hold circuit 37 is omitted and the random signal from the random signal generator 19 is provided directly to the adder 37. In this case, the phase of the clock signal varies even during the counting operation in the duration of each burst signal.

Figure 12:
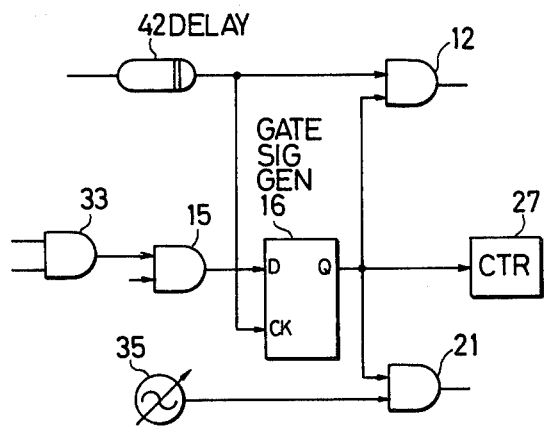
FIG. 12 is a block diagram showing, by way of example, a gate signal generator for converting the auxiliary gate signal into the synchronized gate signal synchronized with the input signal.

The auxiliary gate generating means constituted by the detector 14, the delay circuit 32 and the AND circuit 33 in FIG. 3 may also be replaced with such a circuit arrangement as shown, for instance, in FIG. 11. In FIG. 11, the signal at the input terminal 11 is applied via the detector 14 to a reset terminal of a flip-flop 45 and also is provided via the delay circuit 32 to a detector 46 and, by its detected output, the flip-flop 45 is set, the Q output from which is supplied to the gate circuit 15. The control circuit 26 may be constituted by the microcomputer which is also used as the calculator 26 as described previously, but the control circuit 26 may also be such, for example, as merely compares $$\frac{1}{\tau} \cdot \frac{1}{R^2}$$

computed by the calculator 28 with the count value T of the counter 22. Besides, the gate signal generator 16 need not always be limited specifically to the generation of the synchronized gate signal described in the above, but may also be so arranged as to yield a synchronized signal synchronized with the input signal. For example, as shown in FIG. 12, the auxiliary gate signal from the gate circuit 15 is applied to a data terminal D of the flip-flop of the gate signal generator 16, an input signal from a delay circuit 42 is supplied to the clock terminal ck of this flip-flop and a synchronized gate signal yielded at the Q output terminal of the flip-flop is applied to the gate circuits 12 and 21 and the counter 27.

Figure 13:
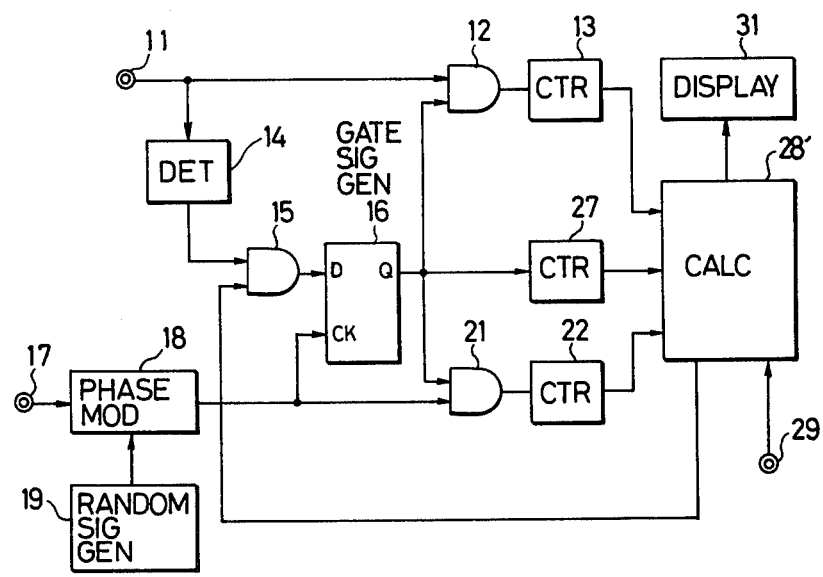
FIG. 13 is a block diagram illustrating another embodiment of the present invention as being applied to the apparatus of FIG. 1.

In the apparatus illustrated in FIG. 1, the measurement accuracy can always be held above the set value in the following manner. As shown in FIG. 13, synchronized gate signals from the gate signal generator 16 are counted by the counter 27, and when it is detected from a calculation by a calculator 28' based on the count values of the counters 22 and 27 and the accuracy set at the terminal 29 that the actual measurement accuracy exceeds the set value in the operation shown in FIG. 6, a control signal from the calculator 28' is stopped, closing the gate circuit 15.

Figure 14:
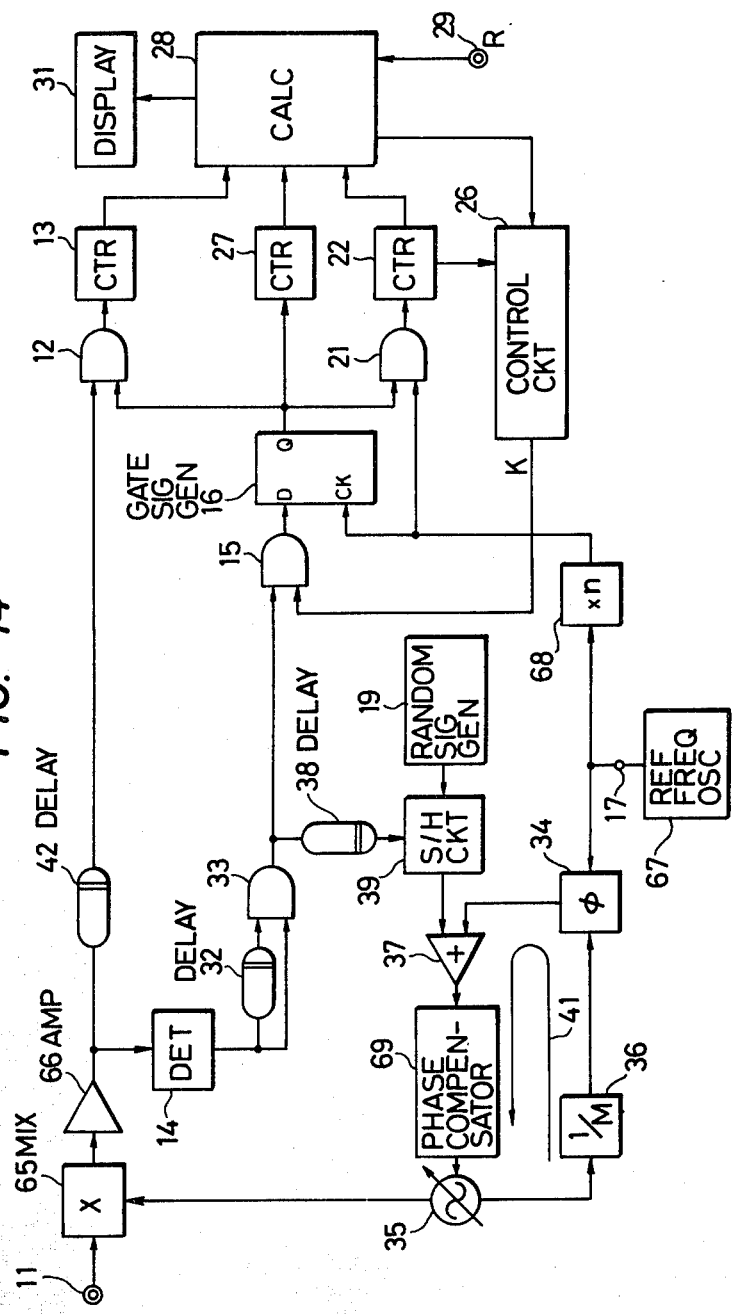
FIG. 14 is a block diagram illustrating another embodiment of the average frequency measuring apparatus of the present invention in which the phase of the input signal is varied at random.

In the above, in order to change the relative phases of the input signal and the synchronized signal at random, the phase of the clock signal is varied at random and, in FIG. 7, the delay of the delay circuit 42 to which the input signal is applied is varied at random. In the case of converting the frequency of the input signal, however, it is also possible to change at random the phase of a local signal for conversion use. For instance, as depicted in FIG. 14 in which the parts corresponding to those in FIG. 3 are identified by the same reference numerals, the input signal from the input terminal 11 is fed to a frequency converter 65, wherein it is frequency converted by the oscillation output from the VCO 35 which is used as the local signal. The frequency converted input signal is amplified by an amplifier 66 and then applied to the detector 14 and the delay circuit 42. In the phase comparator 34, the output from the frequency divider 36 is compared in phase with a reference signal from a reference signal source 67. The reference signal from the reference signal source 67 is frequency multiplied n-fold by a frequency multiplier 68 and then it is provided as a clock signal to the flip-flop 16 and the gate circuit 21. Connected to the output side of the adder 37 is a phase compensator 69. The other circuit arrangements and operations are the same as those in FIG. 3. With such an arrangement, the oscillation phase of the VCO 35 is varied at random upon each occurrence of the burst signal and the phase of the input signal frequency converted by the output from the VCO 35 is also varied at random. The output clock signal from the frequency multiplier 68 has a fixed phase. As the reference signal generator 67, one that yields an output frequency of, for instance, about 1 or 10 MHz is readily available, but it is desirable that the clock signal for measurement be of higher frequency. For this reason, the frequency multiplier 68 is required. In the embodiments of FIGS. 3 and 9, however, a high frequency clock signal is obtained through utilization of the frequency multiplier constructed in a form of the PLL 41 including the frequency divider 36.

Figure 15:
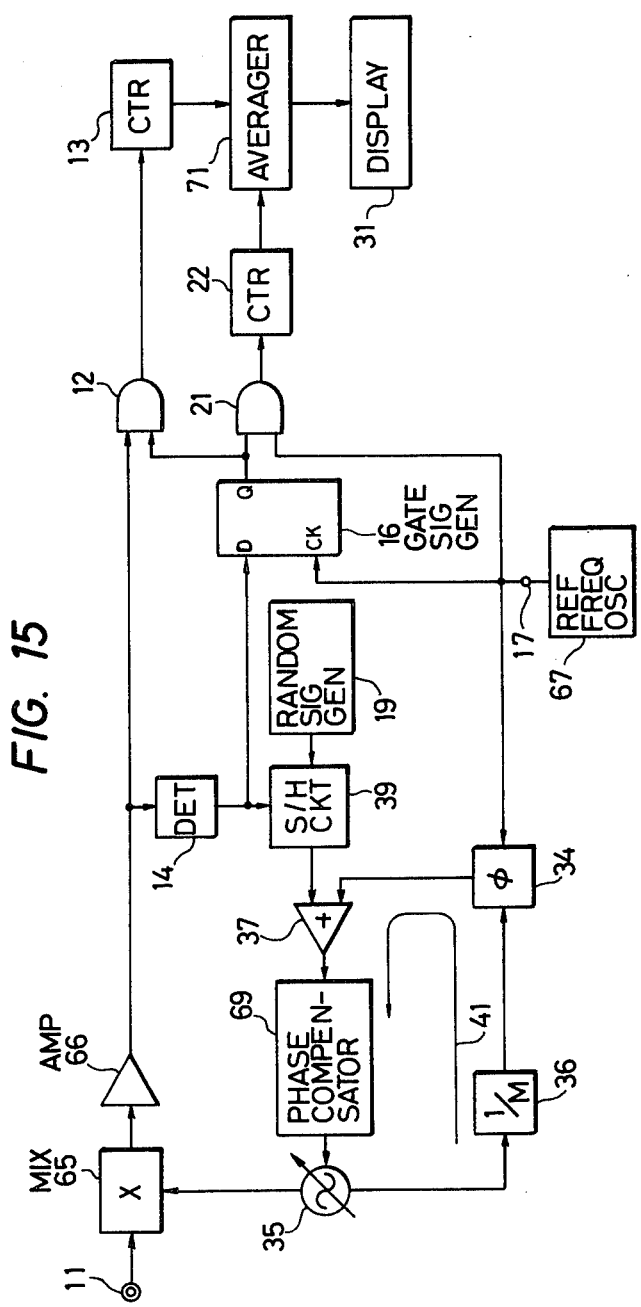
FIG. 15 is a block diagram illustrating a modified form of the apparatus shown in FIG. 14.

In the apparatus described in the foregoing, it is also possible to omit the frequency divider 36 in the PLL 41 and provide, as the phase comparator 34, a high-frequency phase detector which samples the output from the oscillator 35 by the reference signal at the terminal 17. In the embodiments of FIGS. 14 and 15, what is called a high-frequency mixer may be used as the frequency converter 65. Moreover, the counter 27 may also count the auxiliary gate signals though described to count the synchronized gate signals in the foregoing.

While the foregoing embodiments are described to be arranged so that the measurement accuracy may exceed a set value, it is also possible to adopt such an arrangement as depicted in FIG. 15 in which the parts corresponding to those in FIG. 14 are indicated by the same reference numerals. In this case, a calculator 71 is only to divide the count value F of the counter 13 by the count value T of the counter 22. The same is true of the apparatus shown in the other figures. In the foregoing, the relative phases of the input signal and the synchronized gate signal are changed at random, but in the case where oscillation starts upon each occurrence of the burst signal like magnetron oscillation of an electronic range, the phase of each burst signal is at random. Accordingly, in the case of measuring the carrier of such a burst signal, there is no need of forcibly changing the relative phase of the input signal with respect to the synchronized gate signal at random by the employment of the random signal generator 19 as described previously. For instance, in FIG. 3, the random signal generator 19, the adder 37, the delay circuit 38 and the sample hold circuit 39 may be left out.

As has been described in the foregoing, according to the present invention, the average frequency can be measured above a set measurement accuracy and, by superimposing a random signal on a control signal for the VCO in the PLL, the relative phase relation between the input signal and the synchronized gate signal can easily be varied at random. In such a case, the random signal is sampled and held by the sample hold circuit upon each occurrence of the burst signal and is then superimposed for the control voltage of the VCO, by which during the counting operation of a counter the relative phase relation between the input signal and the clock signal is maintained constant, permitting accurate measurement. Furthermore, by adjusting the position and the width of the synchronized gate signal, the frequency of a desired portion of the burst signal can be measured.

It will be apparent that many modifications and variations may be effected without departing from the scope of the novel concepts of the present invention.

What is claimed is:

1. An apparatus for measuring the average frequency of an input signal with a predetermined desired accuracy R, said apparatus comprising:

clock generating means for generating a clock signal having a period $t_0$;

auxiliary gate signal generating means for generating auxiliary gate signals in response to an input thereto, for roughly determining the times for said measuring of said average frequency;

a gate signal generator for converting the auxiliary gate signals from the auxiliary gate generating means into synchronized gate signals synchronized in a predetermined manner with a predetermined one of said clock signal and said input signal;

a first gate controlled by the synchronized gate signals to pass said input signal while the first gate is open;

a second gate controlled by the synchronized gate signals to pass the clock signals from the clock generating means while the second gate is open;

a first counter connected to the first gate, for counting the number F of the input signals passed by the first gate;

a second counter connected to the output side of the second gate, for counting the number T of the clock signals passed by the second gate;

a third counter connected to the output of the gate signal generator, for counting the number N of the synchronized gate signals output therefrom during the counting of said first and second counters;

measurement accuracy setting means for setting said desired accuracy R of the average frequency measuring;

minimum counting time calculating means connected to the second and third counters and to the measurement accuracy setting means, for calculating a minimum counting time corresponding to said accuracy R and the numbers T and N;

counting end detecting means for detecting that the time for which the first, second and third counters perform their counting operation exceeds the minimum counting time calculated by the minimum counting time calculating means and for providing a respective output;

control means for stopping the generation of the synchronized gate signals from the gate signal generator according to said output from the counting end detecting means; and frequency calculating means connected to said first and second counters for calculating the average frequency of the input signals with at least said desired accuracy, as $$\frac{F}{T \times t_0}.$$

2. The apparatus of claim 1 wherein the minimum counting time calculating means calculates a value corresponding to $$\left(\frac{N}{T} \times \frac{1}{R}\right)^2,$$

and the counting and detecting means detects that the count value N of the third counter exceeds the value thereof.

3. The apparatus of claim 1 wherein the minimum counting time calculating means calculates a value corresponding to $T^2R^2$, and the counting and detecting means detects that the count value of N of the third counter becomes smaller than the value thereof.

4. The apparatus of claim 1 wherein the minimum counting time calculating means calculates a value corresponding to $$\frac{N}{t_0 \times T} \times \frac{1}{R^2},$$

and the counting end detecting means detects that the product of the number T and $T_0$ exceeds the value thereof.

5. The apparatus of claim 1, 2, 3 or 4 wherein the minimum counting time calculating means and the counting end detecting means comprise a common microcomputer.

6. The apparatus of claim 5 wherein the frequency calculating means similarly comprises said common microcomputer.

7. The apparatus of claim 1, 2, 3 or 4 wherein the control means comprises a gate circuit which is connected between the auxiliary gate signal generating means and the gate signal generator and controlled by the output from the counting end detecting means to be opened from the start of each said average frequency measurement up to the respective detection by the counting end detecting means.

8. The apparatus of claim 1 including a random signal generator for generating a random signal the level of which varies at random, and phase modulating means for randomly modulating the phase of a predetermined one of said input signals and said the clock signals according to the random signal from the random signal generator.

9. The apparatus of claim 8 wherein the phase modulating means and said clock generating means commonly comprise a reference signal source, a voltage controlled oscillator, a phase comparator for phase comparing a signal corresponding to the output from the voltage controlled oscillator and a reference signal from the reference signal source, and an adder which is supplied with the compared output from the phase comparator and the random signal from the random signal generator to add them and to supply the added output therefrom as a control signal to the voltage controlled oscillator.

10. The apparatus of claim 9 wherein the output from the voltage controlled oscillator is used as the clock signal.

11. The apparatus of claim 9 including a frequency converter for frequency converting the input signal by the output from the voltage controlled oscillator to supply the frequency converted output to the first gate.

12. The apparatus of claim 11 which includes a frequency multiplier for frequency multiplying the reference signal to obtain the clock signal.

13. The apparatus of claim 8 wherein the phase modulating means comprises a variable delay means connected in series to the first gate for delaying the supply of the input signal thereto, and a sample hold circuit for sampling and holding the ramdom signal from the random signal generator by the auxiliary gate signal, the delay of the variable delay means being controlled by the sample hold output from the sample hold circuit.

14. The apparatus of claim 1 wherein:
a variable delay means selectively delays the auxiliary gate signal from the auxiliary gate signal generating means;

a flip-flop comprised in said control means is set by the output from the variable delay means;

the output from the flip-flop is provided as said auxiliary gate signal to the gate signal generator;

upon each counting of a set value L by the second counter, the second counter and the flip-flop are reset;

the minimum counting time calculating means calculates $$\left(\frac{1}{L \times R}\right)^2$$

from the set value L and the set measurement accuracy R;

the counting end detecting means detects that the count value N of the third counter exceeds $$\left(\frac{1}{L \times R}\right)^2;$$

and the frequency calculating means calculates the measured average frequency as $$\frac{F}{N \times L \times t_0}.$$

15. An apparatus for measuring the average value of a series of frequency measurements of an input signal, said apparatus comprising:

clock generating means comprising a random signal generator for generating a random signal of randomly varying level, a voltage controlled oscillator, a phase comparator for phase comparing a signal corresponding to the output from the voltage controlled oscillator and a reference signal, and an analog adder for adding the output from the phase comparator and the random signal to supply the added output as a control signal to the voltage controlled oscillator, the output from the voltage controlled oscillator being used as a clock signal and having an average period $t_0$;

auxiliary gate signal generating means for generating auxiliary gate signals in response to an input thereto for roughly determining a counting time for each said measurement;

a gate signal generator for converting said auxiliary gate signals from the auxiliary gate signal generating means into synchronized gate signals synchronized with a predetermined one of said clock signal from the clock generating means and said input signal;

a first gate connected to the output of the gate signal generator, for being controlled by the synchronized gate signals therefrom to pass said signal during each said measurement;

a second gate connected to the output of the gate signal generator, for being controlled by the synchronized gate signal therefrom to pass the clock signal from the clock generating means during each said measurement;

a first counter connected to the output of the first gate, for counting as the number F the input signal passing through the first gate for said series of measurements;

a second counter connected to the output side of the second gate, for counting as the numbe T the clock signal passing through the second gate for said series of measurements; and frequency calculating means for calculating the average frequency of the input signal, according to $$\frac{F}{T \times t_0},$$

from the values f and T of the first and second counters, respectively.

16. The apparatus of claim 1, 8 or 15 wherein the gate signal generator is a flip-flop for inputting therein the auxiliary gate signals from the auxiliary gate signal generating means in a predetermined manner and to output the synchronized gate signals with a predetermined one of the input signal and the clock signals.

17. The apparatus of claim 1, 2, 3, 8, 9, 11, 14 or 15 wherein the auxiliary gate signal generating means comprises a detector for detecting the envelope of a burst-like input signal.

18. The apparatus of claim 17 wherein the auxiliary gate signal generating means includes delay means for delaying the output from the detector, and an AND circuit for ANDing the output from the delay means and the output from the detector.

19. The apparatus of claim 1, 2, 3, 8, 9, 11, 14 or 15, said input signal comprising bursts, wherein a timing signal is provided in correspondence to said bursts, and wherein the auxiliary gate signal generating means is a pulse generator for generating said auxiliary gate signal with selective timing in response to the timing signal.

20. The apparatus of claim 19 wherein the pulse generator includes means for adjusting the position of at least the leading or trailing edge of the auxiliary gate signal that is output from the pulse generator.

21. The apparatus of claim 9, 11 or 15 which includes a sample hold circuit for sampling and holding the random signal according to the auxiliary gate signal and for supplying the sampled output to the adder for each synchronized gate signal.

22. The apparatus of claim 9 or 15 which includes a frequency divider for frequency dividing the output from the voltage controlled oscillator and for supplying the frequency divided output to the phase comparator.

23. An apparatus for providing the average of a series of measurements of the frequency of an input signal, said apparatus comprising:

a phase lock loop including a phase detector;

a local oscillator the frequency of which is stabilized by the phase lock loop;

a frequency converter for frequency converting the input signal using the output from the local oscillator as a local signal;

means for generating a gate signal corresponding to each of said series of measurements;

a gate supplied with a signal corresponding to the output from the frequency converter and said gate signals, said gate being opened and closed by said gate signals corresponding to said measurements;

a random signal generator for generating a random signal of randomly vaying level for each said measurement;

an adder for superimposing a respective output from the random signal generator on the output from said phase detector in the phase lock loop for each said measurement; and averaging and counting means for counting the output from the gate for each said measurement and averaging the count value for a plurality of said gate signals corresponding to said series of measurements.

24. The apparatus of claim 14, said value L being selectively predetermined.

* * * * *

UNITED STATES PATENT AND TRADEMARK OFFICE
CERTIFICATE OF CORRECTION

PATENT NO. : 4,468,614
DATED : 28 Aug. 1984
INVENTOR(S) : TAKAHASHI et al

It is certified that error appears in the above-identified patent and that said Letters Patent is hereby corrected as shown below:

Column 2, line 32, after "and," insert --while it--.

Column 3, line 20, "clock" should be --block--.

Column 5, line 13, delete "is";
         line 16, delete "is".

Column 7, line 1, after "such" insert --a--.

Column 9, line 13, "that" should be --That--.

Claim 13, line 5, "ramdom" should be --random--.

Claim 15, at line 4 of Column 15, "numbe" should be --number--;
         at line 14 of Column 15, "f" should be --F--.

Claim 23, line 28, "vaying" should be --varying--.

Signed and Sealed this

Twelfth Day of March 1985

[SEAL]

Attest:

DONALD J. QUIGG

*Attesting Officer*      *Acting Commissioner of Patents and Trademarks*